United States Patent
Zhu

(10) Patent No.: US 7,955,921 B2
(45) Date of Patent: Jun. 7, 2011

(54) FULL SILICIDE GATE FOR CMOS

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 11/853,284

(22) Filed: Sep. 11, 2007

(65) Prior Publication Data

US 2009/0065872 A1 Mar. 12, 2009

(51) Int. Cl.
*H01L 21/8238* (2006.01)

(52) U.S. Cl. ............... 438/199; 257/369; 257/E21.632; 257/E21.636; 257/E21.637

(58) Field of Classification Search .............. 438/199; 257/E21.632, E21.636, E21.637, 369
See application file for complete search history.

(56) References Cited

U.S. PATENT DOCUMENTS

| | | | |
|---|---|---|---|
| 4,620,898 A * | 11/1986 | Banks et al. | 204/192.34 |
| 6,555,453 B1 | 4/2003 | Xiang et al. | |
| 6,562,718 B1 | 5/2003 | Xiang et al. | |
| 7,402,535 B2 * | 7/2008 | Nandakumar et al. | 438/791 |

OTHER PUBLICATIONS

A. Veloso et al., "Dual Work Function Phase Controlled Ni-FUSI CMOS (NiSi NMOS, Ni2Si or Ni31Si12 PMOS): Manufacturability, Reliability & Process Window Improvement by Sacrificial SiGe Cap," 2006 *Symposium on VLSI Technology Digest of Technical Papers*, IEEE 2006.

* cited by examiner

*Primary Examiner* — Matthew C Landau
*Assistant Examiner* — Sonya D McCall Shepard
(74) *Attorney, Agent, or Firm* — Daryl K. Neff; H. Daniel Schnurmann

(57) ABSTRACT

A method is provided for fabricating an n-type field effect transistor ("NFET") and a p-type field effect transistor ("PFET") in which the NFET and PFET are formed after which a protective hard mask layer, e.g., a dielectric stressor layer is formed to overlie edges of gates, source regions and drain regions of the PFET and NFET. Sputter etching can be used to remove a portion of the protective hard mask layer to expose the gates of the PFET and NFET. The semiconductor elements can be etched selectively with respect to the protective hard mask layer to reduce a thickness of the semiconductor elements. A metal may then be deposited and caused to react with the reduced thickness semiconductor element to form silicide elements of the gates.

18 Claims, 4 Drawing Sheets

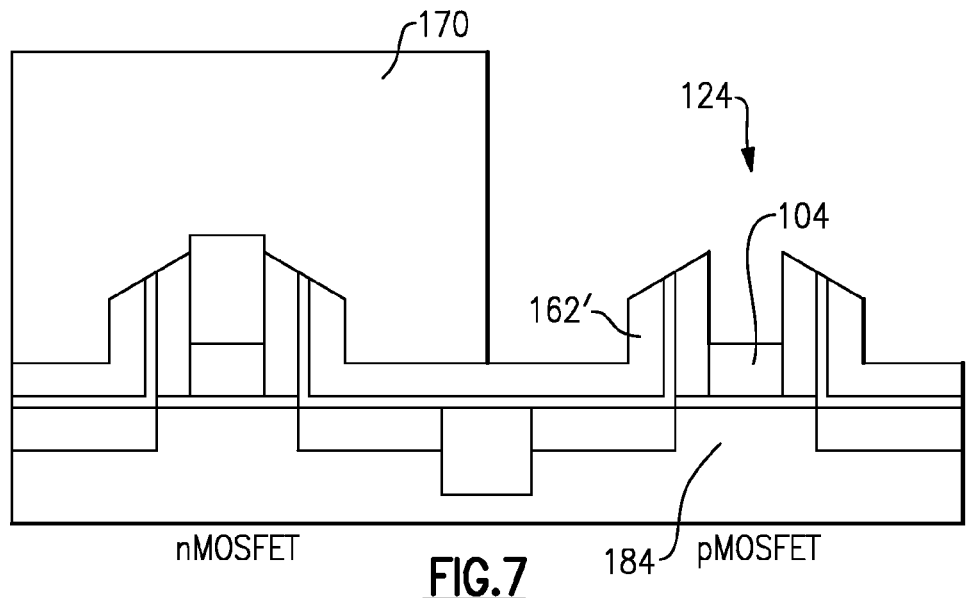
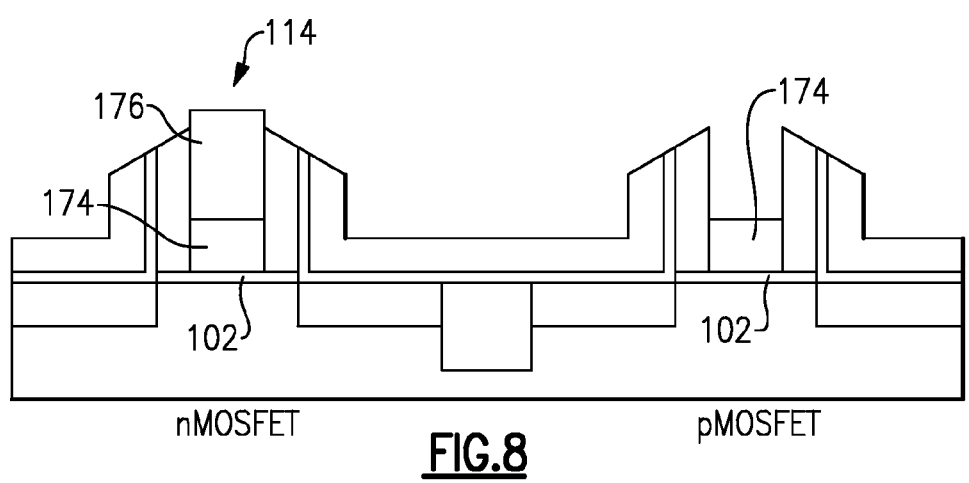
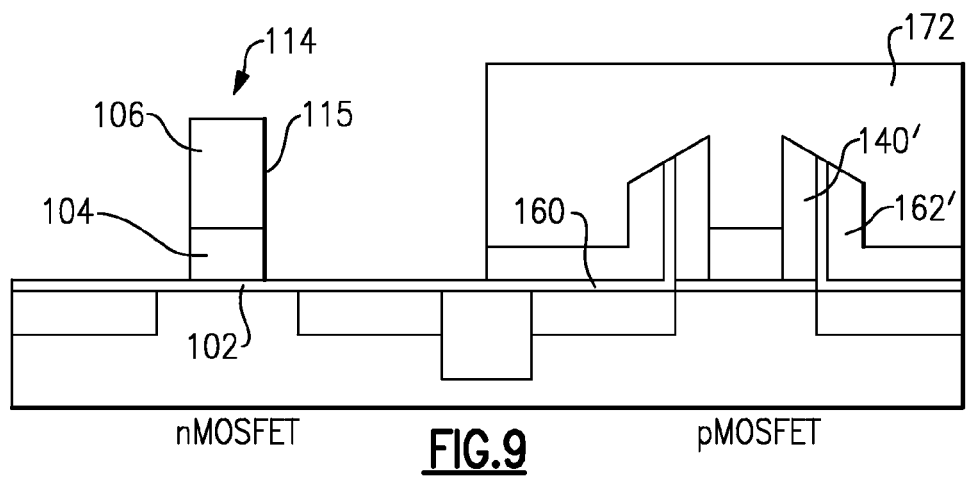

FULL SILICIDE GATE FOR CMOS

BACKGROUND OF THE INVENTION

The present invention relates to semiconductor fabrication processes and semiconductor devices. More particularly, the invention relates to a method of forming field effect transistors with silicide-containing gates.

Field effect transistors ("FETs") can be fabricated with gates that include a silicide. The silicide increases conductivity, can decrease capacitance along the length of the gate conductor and can help decrease the amount of time required to turn on the transistor.

Conventionally, the gate of a FET can include a semiconductor, e.g., polycrystalline silicon ("polysilicon") or other polycrystalline semiconductor material contacting a gate dielectric layer of the FET. A silicide layer may then occupy an overlying portion of the gate in contact with the semiconductor layer. The semiconductor material, e.g., single-crystal silicon, although heavily doped, is relatively resistive, typically having much higher sheet resistance, contact resistance and parasitic resistance than silicide. Typically, these resistance values of silicon are more than 10 times the comparable resistance values of commonly employed silicides.

In complementary metal oxide semiconductor ("CMOS") technology circuits, n-type channel FETs (NFETs) and p-type channel FETs (PFETs) are situated in close proximity to each other and cooperate closely together to perform a circuit function. The performance of a PFET can be improved through use of a compressive stressor layer in close proximity to the channel of the PFET. The performance of an NFET can be improved through use of a tensile stressor layer in close proximity to the channel of the NFET.

U.S. Pat. No. 6,562,718 to Xiang et al. ("the '718 patent") describes a method of forming a full silicide gate. A characteristic of the process described in the '718 patent is the use of chemical mechanical polishing ("CMP") to expose the gate conductor after forming a shield layer for protecting the source and drain regions from further silicidation. One concern about using CMP is that the depth of recess cannot be controlled very well. The depth of recess can vary between different devices. In addition, the gates of some PMOS and NMOS devices may be recessed insufficiently or even excessively. In either case, the yield of microelectronic chips produced by such method can be negatively affected.

The article by A. Veloso et al., entitled "Dual Work Function Phase Controlled Ni-FUSI CMOS (NiSi NMOS, Ni2Si or Ni31Si12 PMOS): Manufacturability, Reliability & Process Window Improvement by Sacrificial SiGe Cap," describes a method of forming full silicide gates of PMOS and NMOS transistors, each with a respective workfunction. However, like the method taught by the '718 patent, CMP is used to expose the polycrystalline semiconductor material (SiGe) of the cap layer. The Veloso et al. Article method also does not describe a method for forming dual stress liners for CMOS transistors having full silicide gates.

SUMMARY OF THE INVENTION

It would be desirable to provide a method of fabricating FETs including NFETs and PFETs, each having silicide-containing gates. It would further be desirable to provide NFETs and PFETs which have full silicide gates, i.e., in which the silicide layer is in contact with the gate dielectric layer. It would further be desirable to fabricate CMOS structures having compressive and tensile stressor layers for improving the performance of PFETs and NFETs therein.

In accordance with an aspect of the invention, a method is provided for fabricating a field effect transistor ("FET") in which a gate including a semiconductor element, a source region and a drain region of the FET are defined, after which a dielectric layer, e.g., a stressor layer is formed to overlie edges of the gate, the source region and the drain region, the stressor layer having an opening exposing a top of the gate. The thickness of the semiconductor element can be removed selectively with respect to the dielectric layer to reduce a thickness of the semiconductor element. A metal may then be deposited and caused to react with the reduced thickness semiconductor element to form a silicide element of the gate.

In accordance with a particular aspect of the invention, a method is provided for fabricating a structure including an n-type field effect transistor ("NFET") and a p-type field effect transistor ("PFET"). In such method, an NFET gate, a PFET gate, and a source region and drain region are defined adjacent to each of the gates, each of the NFET gate and the PFET gate including a semiconductor element. A dielectric layer, e.g., a stressor layer can be formed to overlie edges of the NFET gate and PFET gate, the source regions and the drain regions. Desirably, the dielectric stressor layer has openings exposing tops of the NFET gate and the PFET gate. Portions of at least one of the semiconductor elements of the NFET gate and PFET gate may be selectively removed with respect to the dielectric layer to reduce a thickness of the at least one semiconductor element. A metal may then be deposited and reacted with the semiconductor elements of the NFET gate and the PFET gate to form silicide elements.

In accordance with another aspect of the invention, a method is provided for fabricating a field effect transistor ("FET") in which a gate, a source region and a drain region are defined, the gate including a semiconductor element, the source and drain regions being disposed adjacent to the gate. A layer may be formed to cover the gate, the source region and the drain region. Such layer may be subsequently sputter etched to form a mask layer exposing at least a portion of the gate while leaving the source region and the drain region covered by the mask layer. A metal can then be deposited and caused to react with the semiconductor element of the gate to form a silicide element of the gate.

In accordance with another aspect of the invention, a structure is provided which includes an n-type field effect transistor ("NFET") and a p-type field effect transistor ("PFET"). The structure can include an NFET gate and a PFET gate, where each gate includes a silicide proximate a gate dielectric of the NFET or the PFET, respectively. At least one of the NFET gate or the PFET gate can additionally include a compound of a metal and silicon germanium.

BRIEF DESCRIPTION OF THE DRAWINGS

FIGS. 1 through 11 are sectional views illustrating stages in a method of fabricating a structure including an n-type field effect transistor ("NFET") and a p-type field effect transistor ("PFET") in accordance with an embodiment of the invention.

DETAILED DESCRIPTION

Accordingly, as shown and described with respect to the various figures herein, a method is provided according to an embodiment of the invention in which PMOS and NMOS transistors having full silicide gates are fabricated. As described in accordance with the following embodiments, a method is provided by which PMOS and NMOS transistors having dual stress liners, i.e., a compressive stress liner and a tensile stress liner, can be formed with full silicide gates.

Figure 1:
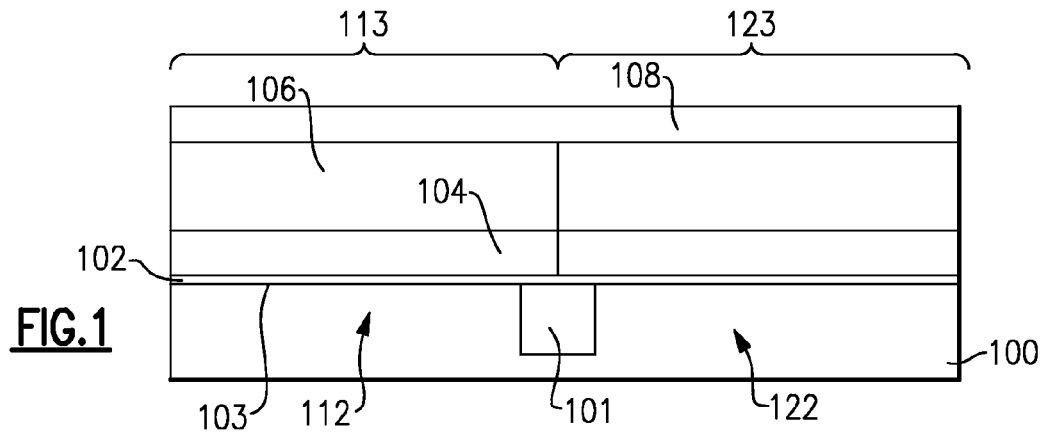

As illustrated in FIG. 1, in a preliminary stage of processing, a substrate 100 includes active semiconductor regions 112, 122 of single-crystal semiconductor material, e.g., single crystal silicon. The active semiconductor regions are laterally separated from each other by a trench isolation region 101. A gate dielectric layer 102 contacts a major surface 103 of the substrate 100, such that it overlies each of the active semiconductor regions 112, 122. The gate dielectric may include, for example, a layer of oxide or a high-k material such as hafnium oxide ($HfO_2$) having a thickness of between about 0.5 nm and 4 nm, for example. The gate dielectric may include a gate oxide formed by thermal oxidation of semiconductor material present at the major surface 103, after appropriately cleaning the surface 103. Threshold voltage implants may be performed into the semiconductor regions 112, 122 before formation of the gate dielectric layer.

Layers of polycrystalline semiconductor material overlie the gate dielectric layer 102. The polycrystalline semiconductor layers may include a layer 104 consisting essentially of polycrystalline silicon, i.e., "polysilicon", having a thickness of between about 10 nm and 50 nm, for example. Desirably, the polysilicon layer contacts or is adjacent to the gate dielectric layer. A second polycrystalline semiconductor layer 106 may consist essentially of polycrystalline silicon germanium or other semiconductor alloy, having a thickness of between about 80 nm and 120 nm, for example. Desirably, the polycrystalline silicon semiconductor material is one that can be selectively etched in relation to polysilicon. An exemplary composition of the polycrystalline silicon germanium includes between about 5% and 10% germanium by weight. A dielectric layer 108, e.g., a layer including or consisting essentially of silicon nitride overlies the second layer 106. An exemplary thickness of the silicon nitride layer is between about 30 nm and 70 nm.

Portions of layers 104 and 106 may be implanted with dopant ions, e.g., phosphorus and boron ions to form different n-type and p-type doped regions 113, 123 overlying each of the active semiconductor regions 112, 122. In such way, regions 112, 122 are doped which have the appropriate workfunction for the NFET and PFET to be fabricated, respectively.

Figure 2:
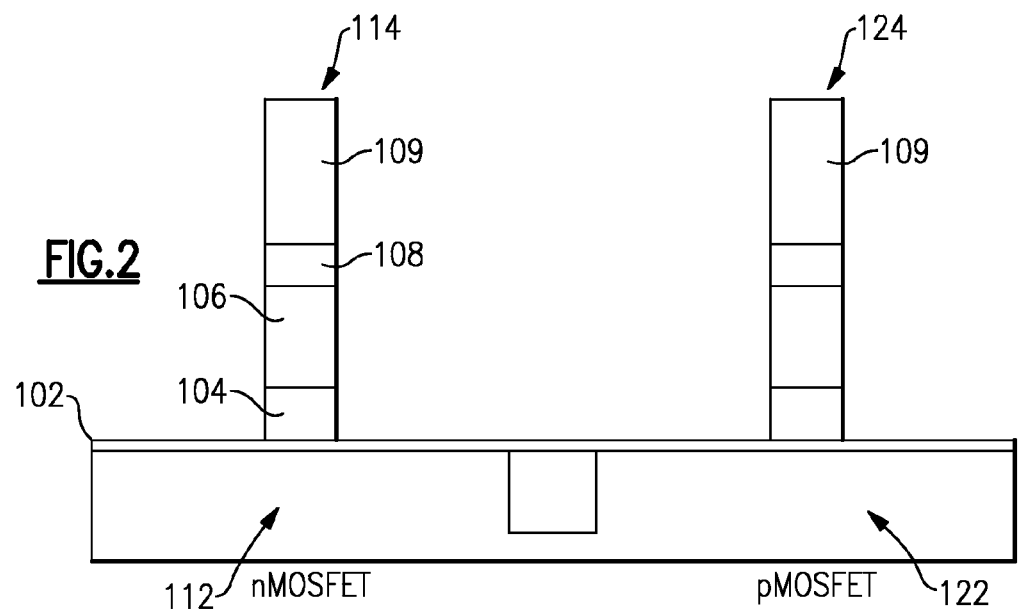

Subsequently, layers 104 and 106 are etched to define a gate 114 (FIG. 2) for an NFET or "nMOSFET" overlying active semiconductor region 112 and a gate 124 for a PFET or "PMOSFET" overlying active semiconductor region 122. In one example, the gates may be etching using a reactive ion etch ("RIE") process, using dielectric layer 108 as a hard mask layer. FIG. 2 further illustrates mask patterns 109 of a photoresist layer used to pattern the hard mask layer 108 and semiconductor layers of the gates.

Figure 3:
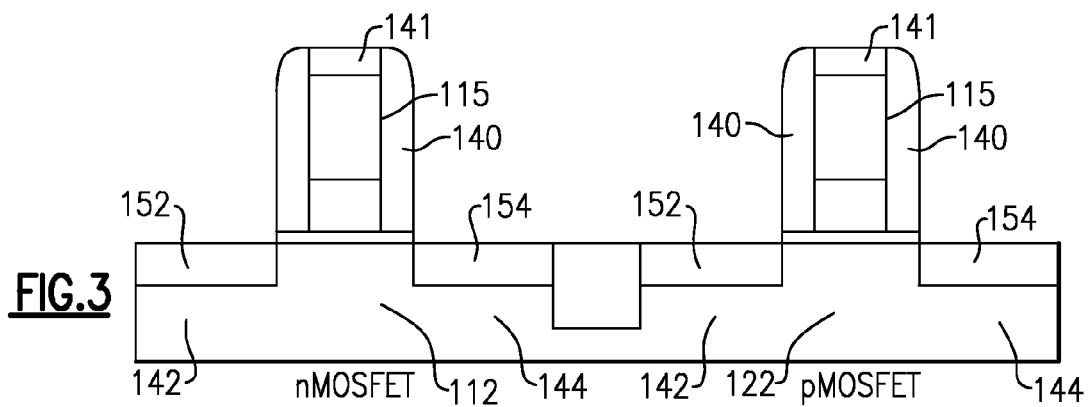

Subsequently, as illustrated in FIG. 3, the photoresist layer is removed, and implants are performed to define halo regions, extension regions or both within the active semiconductor regions. A dielectric spacer layer 140 and dielectric cap layers 141 can then be formed along edges 115 of the gates 112, 122. With the dielectric spacer layer 140 in place, additional implants followed by annealing may be performed to define source regions 142 and drain regions 144 of the nMOSFET and PMOSFET. Exposed portions of the gate dielectric layer 102 can then be removed, after which silicide regions 152, 154 can be formed in self-aligned manner with each of the source regions 142 and drain regions 144, respectively. For example, a metal layer including or consisting essentially of nickel can be blanket deposited to cover the structure including the active semiconductor regions 112, 122, the dielectric spacers and dielectric caps. In one example, for a metal layer consisting essentially of nickel, the metal layer may be deposited to a thickness of between about 5 nm and 20 nm. Subsequently, annealing is performed at a temperature of between about 350 and 500 deg. C., for example, to cause the deposited metal layer to react with the semiconductor material in the active semiconductor regions and form a silicide, e.g., nickel monosilicide (NiSi) for a metal layer including nickel. Deposited metal that has not reacted with semiconductor material during the annealing process, such as that which overlies the dielectric caps and spacers, then is removed by a selective cleaning process.

Figure 4:
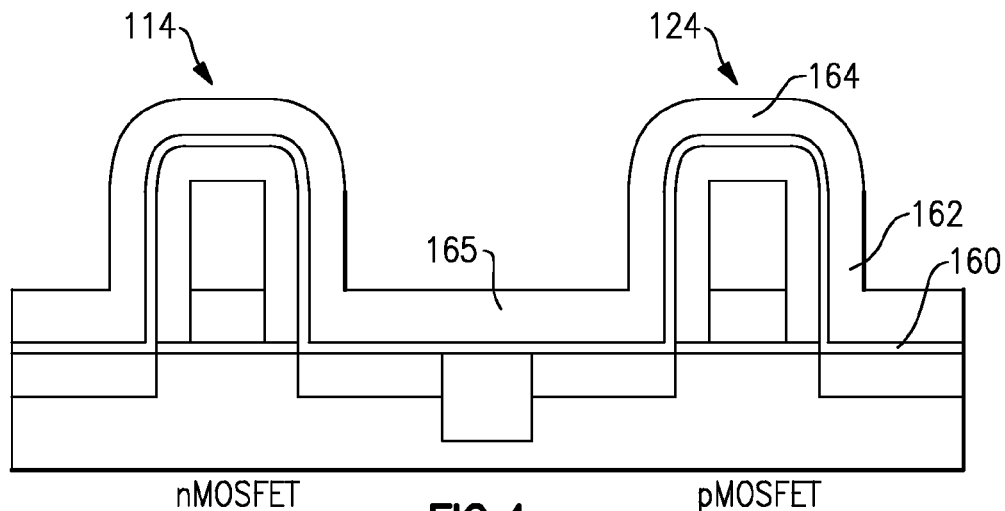

Subsequently, as illustrated in FIG. 4, a relatively thin dielectric layer 160, e.g., an oxide layer having a thickness of between about 5 nm and 10 nm then is deposited over the structure, after which a second dielectric layer 162 then is deposited. In one embodiment, the second dielectric stressor layer includes a stressor layer such as compressive stressed silicon nitride. Through use of the compressive stressed silicon nitride layer, a compressive stress having a magnitude of between about 1 GPa and 5 GPa will generate a compressive stress in a longitudinal direction (direction of the length of the channel region) of the PFET. In addition, a stress will also be generated which lies in a vertical direction of the transistor. An exemplary thickness of for a compressive stressor layer including silicon nitride is between about 30 nm and 100 nm. The compressive stressor layer has areas 164 overlying the gates and areas 165 between the gates.

Figure 5:
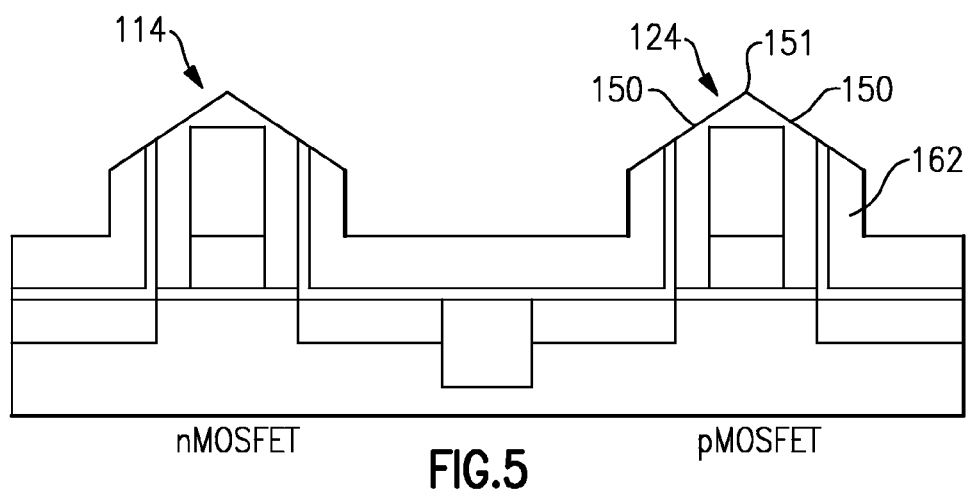

Referring to FIG. 5, sputter etching is used to open the dielectric layer 162 at locations directly above the gates 114, 124. Sputter etching can be performed using argon or nitrogen ions as the predominant agent to reduce the topography of the illustrated structure. When the dielectric layer 162 has smaller thickness overlying the gates 114, 124, the dielectric layer 162 can be more easily opened in those locations while preserving the dielectric layer in other locations. Sputter etching results in the unique "rooftop" structure shown in FIG. 5 which has top surfaces 150 each defining a plane which slopes downwardly away from a peak 151.

Figure 6:
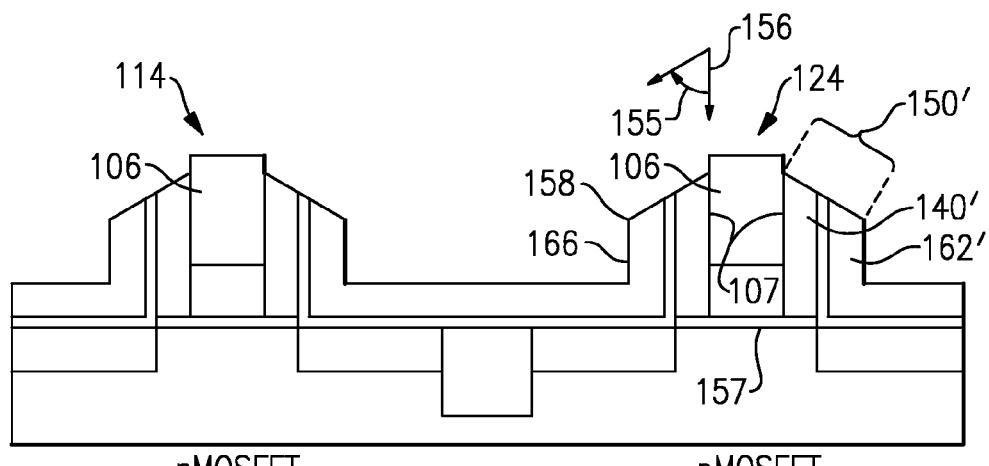

Subsequently, the dielectric layer 162 is etched back such that at least portions of the gates 114, 124 become exposed, as illustrated in FIG. 6. As a result, at least a part of the top surface of the second polycrystalline layer, e.g., poly-SiGe layer 106, becomes exposed. An isotropic wet chemical etch process can be used to etch back the silicon nitride material of both the dielectric stressor layer and the remaining dielectric material of the caps and dielectric spacer layer to produce the structures illustrated in FIG. 6. As illustrated therein, the top surface 150' of a first spacer 140' and a second spacer 162' formed from the dielectric stressor layer defines a plane, such plane being sloped downwardly at a constant angle from an edge 107 of the semiconductor element 106 of the gate.

As further shown in FIG. 6, the top surfaces 150' of the spacers slope downwardly at a substantial angle 155 relative to a normal 156 to a major surface 157 of the single-crystal silicon region over which the PFET gate is disposed. In one embodiment, such angle is between about 30 degrees and about 70 degrees relative to the normal. Another characteristic of the structure illustrated in FIG. 6 is that, in one embodiment, at edges 158 of the second spacers 162', the planes defined by the top surfaces 150' end abruptly. At such edges 158, the slopes changes abruptly between a substantial angle relative to the normal 156 to a very small angle where outer edges 166 of the second spacers 162' begin. The outer edges 166 can be oriented in the same direction as the normal 156 or, typically are oriented at relatively small angles relative to the normal.

Subsequently, as illustrated in FIG. 7, a mask layer 170 is formed to cover the nMOSFET, such as by depositing and photolithographically patterning a photoresist layer. The exposed poly-SiGe layer of the gate 124 then is removed, such as by use of an isotropic reactive-ion-etch (RIE) process which selectively removes the poly-SiGe layer relative to the polysilicon layer 104 thereunder. The compressive dielectric layer including second spacers 162' and the structure of the nMOSFET remain intact, due to the photoresist mask layer 170 and the selective nature of the etch process. With the removal of the poly-SiGe layer of gate 124, the compressive force exerted by the compressive stressor layer 162 on gate 124 is no longer opposed thereby. As a result, compressive stress increases in the active semiconductor region of the PMOSFET, particularly in the channel region 184 immediately beneath the gate 124. The compressive stress present in the channel region of the PMOSFET can increase to a lesser or greater degree, depending upon the dimensions of the gate and relative thicknesses of the poly-SiGe layer, polysilicon layer and second spacers 162'. When the part of the gate 124 remaining after this etch process is about 20 nm in thickness, the longitudinal stress present in the channel region of the PMOSFET may increase by about 100%.

Subsequently, the photoresist layer is stripped from over the nMOSFET, resulting in the structure as shown in FIG. 8. A silicide-forming metal such as nickel then is deposited to cover the structure illustrated in FIG. 8. A low temperature anneal, at a temperature of about 300 deg. C. to about 350 deg. C. can then be conducted to form a region 174 of the PMOSFET gate 124 that includes NiSi where the nickel contacts the polysilicon layer and to form a region 176 including nickel silicide germanium where the nickel contacts the poly-SiGe layer. The resulting silicide region 174 of the PMOSFET may extend to the gate dielectric 102 thereunder. This silicide region 174 typically is a nickel-rich nickel silicide ("Ni-rich NiSi phase"), due to the nature of travel of the various species within the polycrystalline semiconductor material Subsequently, nickel which remains unreacted after the anneal is removed, such as by a selective cleaning process. After removing the unreacted nickel, a second anneal can be performed at a higher temperature (e.g., 400 deg. C. to about 500 deg. C.), improving characteristics of an NiSi layer 174 of the nMOSFET gate 114. The silicide region 174 of the nMOSFET may also extend to the gate dielectric 102 thereunder.

Thereafter, as illustrated in FIG. 9, a photoresist is deposited and patterned to form a mask layer 172 covering the PMOSFET including the first spacers 140', second spacers 162', vertically oriented portions of the oxide layer 160 and the gate thereof. Then, the compressive stressor layer including the second spacers, oxide layer, and dielectric spacers are removed from the gate 114 of the nMOSFET. For example, once the mask layer 172 is in place, a reactive ion etch process can be used to remove these elements selectively with respect to the underlying oxide layer 160. As a result of this processing, edges 115 of the poly-SiGe layer 106 and polysilicon layer 104 of the gate 114 become exposed.

Figure 10:
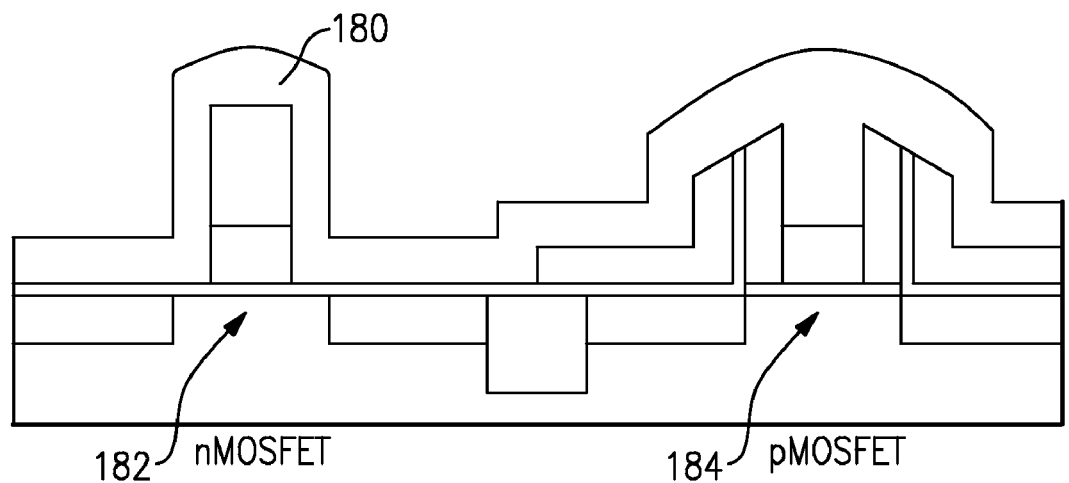

Optionally, as illustrated in FIG. 10, a tensile stressor layer 180 such as a layer of tensile layer including silicon nitride can then be blanket deposited over the structure after the photoresist layer has been stripped from the PMOSFET. The tensile stressor layer applies a tensile stress having a magnitude of between about 300 MPa and 1 GPa to the channel region 182 of the nMOSFET. The tensile stressor layer 180 may be allowed to remain in place over the PMOSFET to enhance the compressive stress in the channel region 184 of the PMOSFET. The presence of a tensile stressor material at that location filling the gate gap can help produce compressive stress in the channel.

Figure 11:
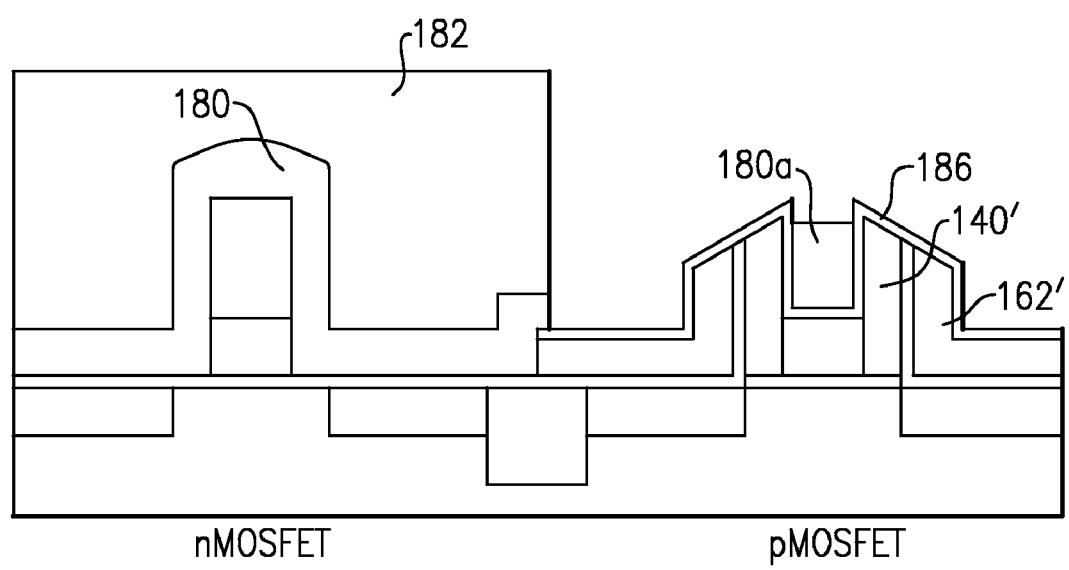

Referring to FIG. 11, in a variation of such process, a thin oxide can be deposited to cover the structure illustrated in FIG. 8, after which a mask layer 172, e.g., a patterned photoresist layer, then is formed to cover the PMOSFET devices as shown in FIG. 9. With the mask 172 in place, the thin oxide and the compressive stressor layer can be removed, as by using a reactive ion etch (RIE). After the mask layer 172 is removed, the thin oxide will still remain in place covering the compressive stressor layer over the PMOSFET. After depositing the tensile stressor layer 180, the nMOSFET can be covered with a mask layer 182, e.g., a patterned photoresist layer. Thereafter, a portion of the tensile stressor layer 180 covering the PMOSFET can be partially removed through a reactive ion etch performed selectively with respect to the underlying oxide layer 186.

As shown in FIG. 11, a portion 180a of the tensile stress layer can be allowed to remain in the gate gap above the silicide gate to enhance the longitudinal compressive stress within the channel region of the PMOSFET. The structure of the spacers 150', including the first spacers 140' and second spacers 162' remaining from etching back the dielectric stressor layer overlying the PFET gate, as shown and described above (FIG. 6) remain in the PMOSFET illustrated in FIG. 11.

The photoresist layer 182 then is removed, and further processing may then be conducted to form an interlevel dielectric layer and conductive contacts to the gates, source regions and drain regions of the nMOSFET and PMOSFET devices.

While the invention has been described in accordance with certain preferred embodiments thereof, many modifications and enhancements can be made thereto without departing from the true scope and spirit of the invention, which is limited only by the claims appended below.

What is claimed is:

1. A method of fabricating a structure including an n-type field effect transistor ("NFET") and a p-type field effect transistor ("PFET"), comprising:
   a) defining an NFET gate, a PFET gate, source regions and drain regions, each of the NFET gate and the PFET gate including a semiconductor element, the source and drain regions being disposed adjacent to the NFET gate and the PFET gate;
   b) forming a dielectric stressor layer overlying edges of the NFET gate and PFET gate, the source regions and the drain regions, the dielectric stressor layer having an opening exposing tops of the NFET gate and the PFET gate, the dielectric stressor layer having a compressive stressor layer at least overlying the source region of the PFET, overlying the drain region of the PFET and overlying the NFET;
   c) removing portions of at least one of the semiconductor elements of the NFET gate and PFET gate selectively with respect to the dielectric stressor layer to reduce a thickness of the at least one semiconductor element; and
   d) depositing and reacting a metal with the semiconductor elements of the NFET gate and the PFET gate to form silicide gates of the NFET and of the PFET,
   wherein, at least after step (d) is performed, the dielectric stressor layer applies a compressive stress having a magnitude of at least 1 GPa to a channel region of the PFET;
   (e) removing a portion of the compressive stressor layer overlying the NFET after step (d); and forming a second dielectric stressor layer overlying the NFET, the second dielectric stressor layer having a tensile stress.

2. A method as claimed in claim 1, wherein the silicide gates contact gate dielectric layers of the NFET and the PFET, respectively.

3. A method of fabricating a structure as claimed in claim 1, wherein step (c) increases a magnitude of a compressive stress applied by the compressive stressor layer to the channel region of the PFET.

4. A method of fabricating a structure as claimed in claim 1, wherein each of the NFET gate and the PFET gate includes a first semiconductor portion consisting essentially of silicon and a second semiconductor portion consisting essentially of silicon germanium overlying the first semiconductor portion, wherein step (c) at least substantially removes the second semiconductor portion of the gate of the NFET or of the gate of the PFET selectively with respect to the first semiconductor portion of the respective gate.

5. A method as claimed in claim 1, wherein the step of forming the dielectric compressive stressor layer in step (b) includes depositing a layer of dielectric material covering the NFET gate and the PFET gate, the deposited dielectric layer having an internal compressive stress sufficient to apply a compressive stress of at least 1 GPA to a channel region of the PFET, then reducing a height of the deposited dielectric material above the NFET gate and above the PFET gate by sputter etching the deposited dielectric layer, and then etching back the sputter etched dielectric layer by a subsequent wet chemical process to expose the semiconductor elements of the NFET gate and of the PFET gate.

6. A method as claimed in claim 2, wherein said silicide gate of said NFET consists essentially of NiSi.

7. A method of fabricating a structure as claimed in claim 3, wherein step (c) increases the magnitude of the compressive stress applied to the channel region by greater than 50%.

8. A method as claimed in claim 6, wherein said silicide gate of said PFET consists essentially of Ni-rich NiSi.

9. A method of fabricating a structure including an n-type field effect transistor ("NFET") and a p-type field effect transistor ("PFET"), comprising:
a) defining an NFET gate, a PFET gate, source regions and drain regions, each of the NFET gate and the PFET gate including a semiconductor element, the source and drain regions being disposed adjacent to the NFET gate and the PFET gate;
b) forming a dielectric stressor layer overlying edges of the NFET gate and PFET gate, the source regions and the drain regions, the dielectric stressor layer having an opening exposing tops of the NFET gate and the PFET gate;
c) removing portions of at least one of the semiconductor elements of the NFET gate and PFET gate selectively with respect to the dielectric stressor layer to reduce a thickness of the at least one semiconductor element; and
d) depositing and reacting a metal with the semiconductor elements of the NFET gate and the PFET gate to form silicide gates of the NFET and of the PFET,
wherein, at least after step (d) is performed, the dielectric stressor layer applies a compressive stress having a magnitude of at least 1 GPa to a channel region of the PFET, and wherein the method further comprises forming a spacer layer overlying edges of the PFET gate and step (b) further comprises etching the dielectric stressor layer and the spacer layer to form spacers, each spacer having a top surface defining a plane, the plane sloped downwardly at a constant angle from edges of the PFET gate.

10. A method of fabricating a structure as claimed in claim 9, wherein the PFET gate overlies a major surface of a single-crystal silicon region and the constant angle is between about 30 degrees and about 70 degrees relative to a normal to the major surface of the single-crystal silicon region.

11. A method of fabricating a structure including an n-type field effect transistor ("NFET") and a p-type field effect transistor ("PFET"), comprising:
a) forming the NFET and the PFET, each having a gate disposed in a vertical direction above a surface of a channel region, a source region and a drain region, each gate including a semiconductor element, the source and drain regions being disposed adjacent to each gate;
b) forming a protective layer covering the gate, the source region and the drain region of each of the NFET and PFET;
c) sputter etching the protective layer to expose at least portions of the gates of the NFET and PFET while leaving the source region and the drain region covered by the protective layer, so as to reduce a thickness of the protective layer in the vertical direction above the gates selectively relative to the thickness of the protective layer in the vertical direction above the source regions and above the drain regions;
d) depositing a metal and causing the metal to react with the semiconductor elements of the gates to form silicide elements of the gates,
wherein the step of forming the protective layer in step (b) includes depositing a layer of dielectric material covering the NFET gate and the PFET gate, the deposited dielectric layer having an internal compressive stress sufficient to apply a compressive stress of at least 1 GPA to a channel region of the PFET, and the method further includes etching back the sputter etched dielectric layer by a subsequent wet chemical process to expose the semiconductor elements of the NFET gate and of the PFET gate.

12. A method as claimed in claim 11, wherein the silicide elements of the gates contact gate dielectric layers of the NFET and the PFET, respectively.

13. A method as claimed in claim 11, wherein the protective layer having the internal compressive stress overlies at least the source region of the PFET and the drain region of the PFET.

14. A method as claimed in claim 11, wherein the protective layer prior to step (c) has smaller thickness where the protective layer overlies the gates than where the protective layer overlies the source regions and the drain regions.

15. A method of fabricating a structure as claimed in claim 11, wherein each of the NFET gate and the PFET gate includes a first semiconductor portion consisting essentially of silicon and a second semiconductor portion consisting essentially of silicon germanium overlying the first semiconductor portion, wherein step (c) at least substantially removes the second semiconductor portion of the gate of the NFET or of the gate of the PFET selectively with respect to the first semiconductor portion of the respective gate.

16. A method of fabricating a structure as claimed in claim 13, further comprising a step of recessing the gate of the PFET while protecting the gate of the NFET from being recessed prior to performing step (d).

17. A method of fabricating a structure as claimed in claim 13, wherein step (b) includes forming the compressive stressor layer overlying the NFET, the method further comprising, after step (d), a step (e) removing a portion of the compressive stressor layer overlying the NFET and forming a second dielectric stressor layer overlying the NFET, the second dielectric stressor layer having a tensile stress.

18. A method of fabricating a structure as claimed in claim 16, wherein the step of recessing the gate of the PFET increases the magnitude of the compressive stress applied to the channel region by greater than 50%.

* * * * *